United States Patent [19] [11] 4,315,131
Townend et al. [45] Feb. 9, 1982

[54] ELECTRON DISCHARGE HEATING DEVICES

[75] Inventors: Rodney Townend, Clwyd, Wales; Joseph B. Wareing, Chester; Raymond Winstanley, South Wirral, both of England

[73] Assignee: The Electricity Council, England

[21] Appl. No.: 85,364

[22] Filed: Oct. 16, 1979

[30] Foreign Application Priority Data

Oct. 30, 1978 [GB] United Kingdom ............. 42448/78

[51] Int. Cl.³ ........................ B23K 15/00; H01J 37/06
[52] U.S. Cl. ........................ 219/121 EB; 219/121 EZ; 219/121 ET; 313/30; 313/46; 313/452; 313/297; 313/306; 165/104.21; 422/186.4; 422/903
[58] Field of Search ................. 219/121 EZ, 121 ET, 219/121 EB, 121 EA, 121 P; 313/446, 452, 30, 306, 46, 299, 39, 297, 40; 165/105; 250/531, 535, 540, 541

[56] References Cited

U.S. PATENT DOCUMENTS

| | | | |
|---|---|---|---|
| 3,210,454 | 10/1965 | Morley | 219/121 EZ X |
| 3,286,021 | 11/1966 | Koch | 219/121 ET |
| 3,294,954 | 12/1966 | Ramsey | 219/121 EZ |
| 3,632,299 | 1/1972 | Thorsen | 250/540 |
| 3,678,334 | 7/1972 | Dugdale et al. | 219/121 ET |
| 3,720,828 | 3/1973 | Nablo | 219/121 ET |
| 3,735,175 | 5/1973 | Blomgren, Jr. | 165/105 |
| 3,792,318 | 2/1974 | Fries et al. | 165/105 |
| 3,814,829 | 6/1974 | Mouchan et al. | 219/121 EZ |
| 3,827,480 | 8/1974 | Gammel et al. | 165/105 |
| 4,130,490 | 12/1978 | Flamm et al. | 250/531 |

Primary Examiner—B. A. Reynolds
Assistant Examiner—Mark H. Paschall
Attorney, Agent, or Firm—Beveridge, DeGrandi, Kline & Lunsford

[57] ABSTRACT

Dimensional stability of an electron discharge heating device having electrodes for focussing the discharge current is improved by providing one or more heat pipes for transferring heat from an electrode to cooling fins outside the vacuum chamber. In one embodiment, a second electrode is water-cooled. The improved cooling not only permits of use of a structure which takes a short time to reach thermally stable conditions due to the small heat capacity of the solid material but also permits of different parts of the gun assembly being operated at different temperatures.

2 Claims, 3 Drawing Figures

ELECTRON DISCHARGE HEATING DEVICES

BACKGROUND OF THE INVENTION

1. Field of the Invention

This invention relates to glow discharge heating devices in which energy is transferred to a workpiece by a fine-focus discharge.

2. Description of the Prior Art

For non-contacting energy transfer to effect heating of a workpiece, such as a fine wire or strip, a glow discharge device may be used. Such techniques are employed for example in the continuous treatment of wire or strip which is moved through the heating device. The power has to be concentrated in the spatial region through which the workpiece passes and this requires a fine focus of the electron beam with the focus location remaining stable over long periods of time.

The power delivered to the workpiece must always be less than that applied to the heating device and thus the electron gun assembly of a glow discharge heating device is subjected to power dissipation with consequent temperature rise. The increase in temperature, if not controlled, leads to dimensional changes and variability in performance until a steady state condition is achieved. Typically, with existing types of glow discharge heating devices for heating wire or strip, a period of 20-25 minutes might be required to achieve a steady state. During this time the workpiece has not experienced the correct heat treatment. This long delay period and consequent waste of material may make the whole process uneconomic.

Although, in principle, this problem could be overcome by the use of materials for the heating device having little or no temperature coefficient of expansion, such materials, in practice, may not be suitable nor has it been found practicable to put a coating of a suitable material on a dimensionally stable structure.

SUMMARY OF THE INVENTION

According to the present invention, in a glow discharge heating device comprising an electron discharge gun with electrodes for focussing the electron discharge, at least one heat pipe is provided for extracting heat from the electrode structure and dissipating it remotely from said electrodes.

The improved heat transfer enables stable heat conditions to be obtained much more rapidly than without a heat pipe or pipes. More particularly however it facilitates the design of the device to operate at required temperatures.

Differing materials may have their optimum performance at different operating temperatures and the use of one or more heat pipes permits of heat transfer from selected parts of the structure. In a device having an anode and a cathode, one of which, in operation, is maintained at earth potential, means may be provided for circulating a coolant fluid, e.g. water, through the earthed electrode and the heat pipe or pipes may be arranged to extract heat from the non-earthed electrode.

The normal heat loss in a glow discharge gun without any heat pipe may, in some cases, be insufficient to enable the correct operating temperature to be maintained. The use of a heat pipe with the consequent improved heat transfer enables an auxiliary heater to be employed, the extra heating being balanced against the improved cooling, to enable a higher operating temperature to be achieved. Such an auxiliary heater may also be used to stabilise the temperature of the device before it is employed to deliver power to the workpiece.

The present invention also permits of components being made of thin section material, which allows of rapid achievement of dimensional stability; this is because the heat pipe permits of heat sinking amounts of energy which are large compared with the heat capacity of the thin section without allowing significant temperature changes to develop in that section.

DESCRIPTION OF THE PREFERRED EMBODIMENT

Figure 1:
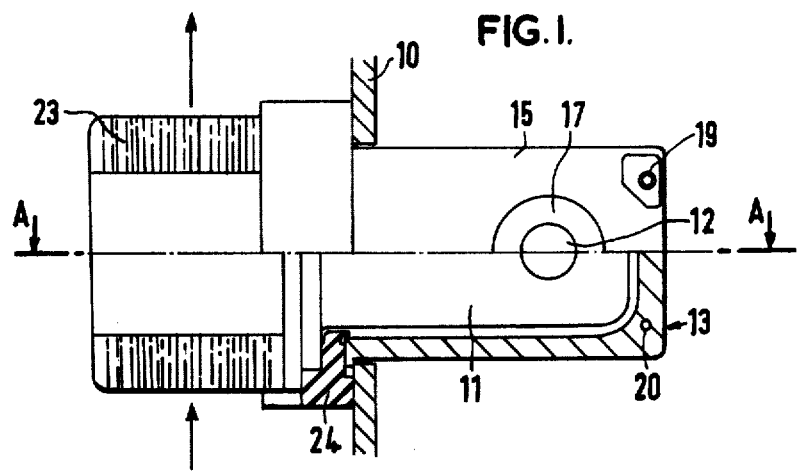
FIG. 1 is a side elevation, partly in section, of a glow discharge gun assembly for the continuous heat treatment of fine wire.
Figure 2:
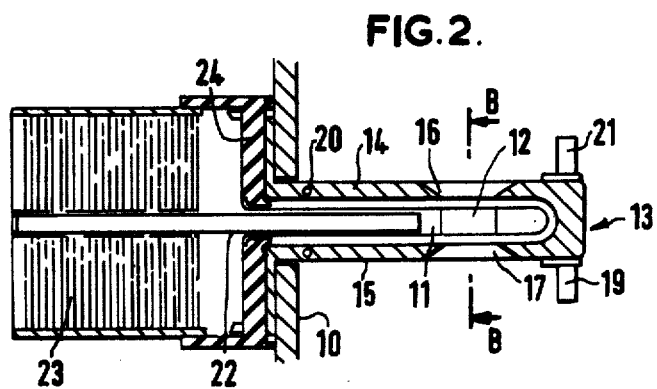
FIG. 2 is a section along the line A—A of FIG. 1.

The glow discharge gun illustrated in the drawings and forming one embodiment of the invention is for the continuous heat treatment of a fine wire which is moved, at uniform speed, through the electrode system along the line B—B of FIG. 2. This electrode system is arranged within a vacuum chamber, part of the wall of which is shown at 10 (in FIGS. 1 and 2), the gun extending through this wall. The electrode system comprises a metal cathode 11 which has an aperture 12, the axis of which is aligned with the path of movement of the wire. The anode 13 has portions 14, 15 which lie, one on each side of the cathode. The portions 14, 15 have apertures 16, 17 respectively which are aligned with the aperture 12. The cathode and anode co-operate, in the known way, to focus the discharge current along the axis of the apertures. For the heat treatment of a fine wire, dimensional stability of the whole gun assembly is important.

Figure 3:
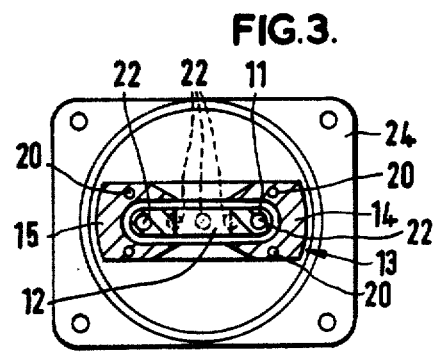
FIG. 3 is a section along the line B—B of FIG. 2.

In this particular embodiment, the anode is earthed and is water-cooled, the water entering by a water connector 19 (FIGS. 1 and 2) and passing through ducts 20 (FIG. 3) to an outlet 21 (FIG. 2). The coolant flow is controlled to achieve the required operating temperature for the anode.

The cathode is internally drilled to take a number of heat pipes 22 which fit closely within the drilled holes, a thermally conductive filling compound being used to ensure good thermal contact. The heat pipes extend outwardly through the cathode structure and have fins 23 forming cooling surfaces outside the vacuum chamber. An insulating wall 24 is provided between the fins and the wall 10. A fan (not shown) provides a cooling air stream over the fins.

In an arrangement in which the cathode is earthed, it may be convenient to cool the cathode by circulating water therethrough and to provide the heat pipes for cooling the anode.

It has been found, that by using heat pipes for cooling, the thermal capacity can be significantly reduced compared with previous forms of construction and that stable temperature conditions can be reached in less than 2 minutes. Auxiliary heating means moreover may be provided to enable the required temperature conditions to be reached before the operating potentials are applied to the electrodes to deliver power to the workpiece.

The temperature control of the gun leads to a further advantage. The cleanliness of the gun, particularly with regard to oxidation, and hence its stability against electrical breakdown is affected by its temperature. The use of a heat pipe or pipes facilitates the control of the temperature of the active parts of the electrodes whilst maintaining the overall dimensional stability of the gun as a whole. Different materials may have their optimum performance at different operating temperatures and hence the ability to control the temperatures of different parts of the gun further facilitates optimization of the design.

We claim:

1. A glow discharge heating device for the continuous heat treatment of an elongate workpiece movable through the heating device, said heating device comprising a plurality of wall members defining a vacuum chamber, an electron discharge gun having anode and cathode electrodes in said chamber; said cathode electrode comprising an elongate plate member mounted in one wall of the chamber to extend into the chamber and having a circular aperture through the plate member near the end thereof in the chamber; said anode electrode comprising two plate members, one on each side of, adjacent to, and parallel with the cathode electrode; each anode plate member having a circular aperture therethrough axially aligned with the aperture in the cathode electrode; means for applying an electric potential between the cathode and anode electrodes while maintaining the anode electrode at earth potential to produce an electron discharge focussed on the axis of the apertures; means for passing an elongate workpiece through the vacuum chamber and through the electrode apertures along the axis thereof; means defining ducts in each of the anode members; means for circulating a coolant fluid through said ducts; at least one heat pipe member partially within the cathode electrode and extending within the cathode electrode from a point adjacent the cathode aperture through the wall of the chamber; and a plurality of heat dissipating cooling surfaces outside the chamber and contacting the pipe member to dissipate heat therefrom.

2. A heating device as claimed in claim 1 and having auxiliary heating means for heating at least a part of at least one electrode.

* * * * *